(12) United States Patent
Lin et al.

(10) Patent No.: US 11,545,385 B2
(45) Date of Patent: Jan. 3, 2023

(54) METHOD FOR FABRICATING ELECTRONIC PACKAGE AND CARRIER STRUCTURE THEREOF

(71) Applicant: SILICONWARE PRECISION INDUSTRIES CO., LTD., Taichung (TW)

(72) Inventors: Tse-Yuan Lin, Taichung (TW); Chun-Ming Laio, Taichung (TW); Yu-Chih Cheng, Taichung (TW)

(73) Assignee: SILICONWARE PRECISION INDUSTRIES CO., LTD., Taichung (TW)

(*) Notice: Subject to any disclaimer, the term of this patent is extended or adjusted under 35 U.S.C. 154(b) by 51 days.

(21) Appl. No.: 17/209,494

(22) Filed: Mar. 23, 2021

(65) Prior Publication Data

US 2022/0028721 A1 Jan. 27, 2022

(30) Foreign Application Priority Data

Jul. 21, 2020 (TW) .................................. 10912584

(51) Int. Cl.
| | |
|---|---|
| H01L 21/683 | (2006.01) |
| H01L 21/48 | (2006.01) |
| H01L 21/56 | (2006.01) |
| H01L 21/78 | (2006.01) |
| B32B 17/10 | (2006.01) |

(Continued)

(52) U.S. Cl.
CPC ............ *H01L 21/6835* (2013.01); *B32B 7/14* (2013.01); *B32B 17/10* (2013.01); *B32B 27/20* (2013.01); *B32B 27/36* (2013.01); *C08L 67/02* (2013.01); *H01L 21/4853* (2013.01); *H01L 21/4857* (2013.01); *H01L 21/563* (2013.01); *H01L 21/565* (2013.01); *H01L 21/568* (2013.01); *H01L 21/78* (2013.01); *B32B 2264/1021* (2020.08); *B32B 2457/08* (2013.01); *H01L 2221/68372* (2013.01)

(58) Field of Classification Search
CPC ............ H01L 21/6835; H01L 21/4853; H01L 21/4857; H01L 21/563; H01L 21/565; H01L 21/568; H01L 21/78; H01L 2221/68372; H01L 2224/18; H01L 2224/73204; H01L 23/3128; H01L 2221/68327; H01L 2221/68345; H01L 23/49816; H01L 23/49894; H01L 23/5383; H01L 21/561; B32B 7/14; B32B 17/10; B32B 27/20; B32B 27/36; B32B 2264/1021; B32B 2457/08; C08L 67/02
USPC .......................................................... 438/113
See application file for complete search history.

(56) References Cited

U.S. PATENT DOCUMENTS

| | | | |
|---|---|---|---|
| 11,174,397 B2 * | 11/2021 | Martin ..................... | C09D 7/63 |
| 2007/0172646 A1 * | 7/2007 | Tanabe ..................... | G02B 1/14 |
| | | | 428/421 |

(Continued)

FOREIGN PATENT DOCUMENTS

CN 107603169 A * 1/2018 ............. C08L 67/02

*Primary Examiner* — Vu A Vu
(74) *Attorney, Agent, or Firm* — Kelly & Kelley, LLP

(57) ABSTRACT

A carrier structure having a strengthening layer is provided. The strengthening layer comprises 5 to 30% by weight polysiloxane, 1 to 20% by weight silicon dioxide, and 60 to 85% by weight polyethylene terephthalate (PET) film. The carrier structure is used in a semiconductor packaging process for improving the process reliability.

10 Claims, 9 Drawing Sheets

(51) Int. Cl.
    *B32B 7/14*    (2006.01)
    *B32B 27/36*    (2006.01)
    *B32B 27/20*    (2006.01)
    *C08L 67/02*    (2006.01)

(56) References Cited

U.S. PATENT DOCUMENTS

| | | | |
|---|---|---|---|
| 2016/0088756 A1* | 3/2016 | Ramadas | H01L 51/5259 361/728 |
| 2019/0196633 A1* | 6/2019 | Lin | G06F 3/044 |
| 2021/0230763 A1* | 7/2021 | Kozicki | C25D 5/48 |

* cited by examiner

METHOD FOR FABRICATING ELECTRONIC PACKAGE AND CARRIER STRUCTURE THEREOF

CROSS-REFERENCE TO RELATED APPLICATIONS

This application claims priority to Taiwan Application Serial No. 109124584, filed on Jul. 21, 2020. The entirety of the application is hereby incorporated by reference herein and made a part of this specification.

BACKGROUND

1. Technical Field

The present disclosure relates to semiconductor packaging processes, and more particularly, to a method for fabricating an electronic package and a carrier structure thereof.

2. Description of Related Art

Along with the rapid development of electronic industries, electronic products are developed toward the trend of multi-function and high performance. Accordingly, fan-out packaging technologies have been developed to meet the miniaturization requirement of semiconductor packages.

FIG. 1 is a schematic cross-sectional view showing a method for fabricating a semiconductor package 1 according to the prior art. Referring to FIG. 1, a circuit structure 11 is formed on an adhesive layer 100 of a carrier 10. The circuit structure 11 has a dielectric layer 110 and a circuit portion 111. A plurality of semiconductor elements 15 are flip-chip disposed on the circuit structure 11 through a plurality of conductive bumps 16 and an underfill 17, and electrode pads 150 of the semiconductor elements 15 are electrically connected to the circuit portion 111 through the conductive bumps 16. Thereafter, an encapsulating layer 18 is formed on the circuit structure 11 by lamination for encapsulating the semiconductor elements 15.

Subsequently, the carrier 10 and the adhesive layer 100 are removed and ball mounting and singulation processes are performed.

However, in the method for fabricating the semiconductor package 1, under high temperature (for example, in the flip-chip process), delamination may occur between the carrier 10 and the adhesive layer 100, thus adversely affecting the subsequent processes.

Therefore, how to overcome the above-described drawbacks of the prior art has become an urgent issue in the art.

SUMMARY

In view of the above-described drawbacks of the prior art, the present disclosure provides a carrier structure, which comprises: a strengthening layer. Therein, the strengthening layer comprises 5 to 30 wt % of polysiloxane, 1 to 20 wt % of silicon dioxide, and 60 to 85 wt % of polyethylene terephthalate (PET) film, based on the total weight of the strengthening layer.

In an embodiment, the carrier structure further comprises a carrier having a release layer, the strengthening layer and a bonding layer sequentially formed thereon.

The present disclosure further provides a method for fabricating an electronic package, which comprises: providing the carrier structure as described above; performing a packaging process of an electronic element on the carrier structure; and removing the carrier structure.

In an embodiment, the packaging process of the electronic element comprises: forming a circuit structure on the carrier structure; disposing the electronic element on the circuit structure; and forming an encapsulant on the circuit structure for encapsulating the electronic element. After the carrier structure is removed, the circuit structure is exposed so as for conductive elements to be formed thereon.

In an embodiment, the packaging process of the electronic element comprises: disposing the electronic element on the carrier structure; and forming an encapsulant on the carrier structure for encapsulating the electronic element. For example, after the carrier structure is removed, a circuit structure is formed on the encapsulant and the electronic element and electrically connected to the electronic element. Alternatively, before the carrier structure is removed, a circuit structure is formed on the encapsulant and the electronic element and electrically connected to the electronic element. Further, conductive elements are formed on the circuit structure.

In an embodiment, after removing the carrier structure, the method further comprises performing a singulation process.

Therefore, through the design of the strengthening layer, the present disclosure prevents delamination of the carrier structure under high temperature. Compared with the prior art, the present disclosure allows the required process to be performed smoothly.

BRIEF DESCRIPTION OF THE DRAWINGS

FIG. 2D' is a schematic cross-sectional view showing another aspect of FIG. 2D.

FIGS. 3B' to 3D' are schematic cross-sectional views showing another aspect of FIGS. 3B to 3D, respectively.

DETAILED DESCRIPTION OF THE EMBODIMENTS

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "third," "up," "down," "a," etc., are merely for illustrative purposes and should not be construed to limit the scope of the present disclosure.

FIGS. 2A to 2F are schematic cross-sectional views showing a method for fabricating an electronic package 2 according to a first embodiment of the present disclosure.

Figure 1:
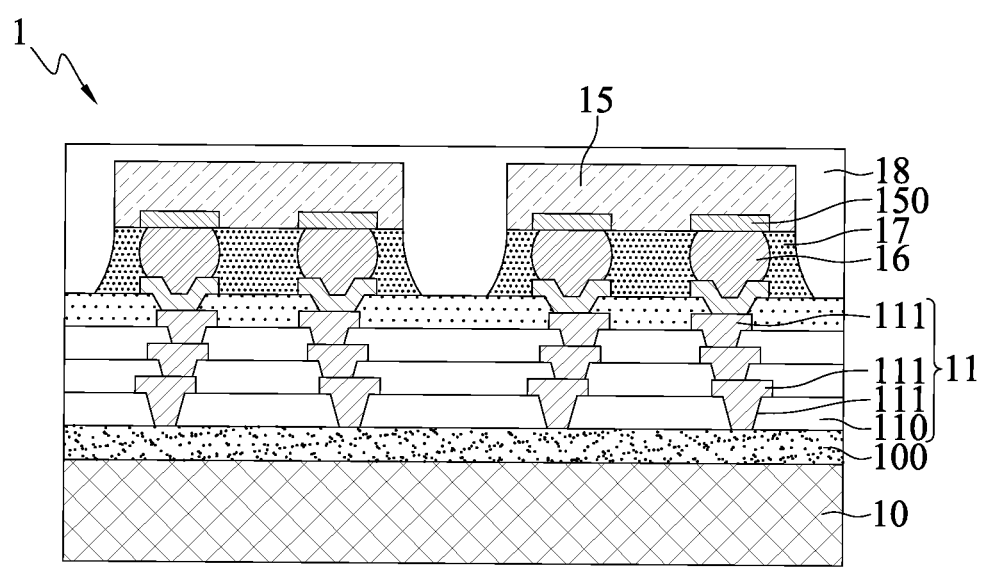
FIG. 1 is a schematic cross-sectional view showing a method for fabricating a semiconductor package according to the prior art.
Figure 2A:
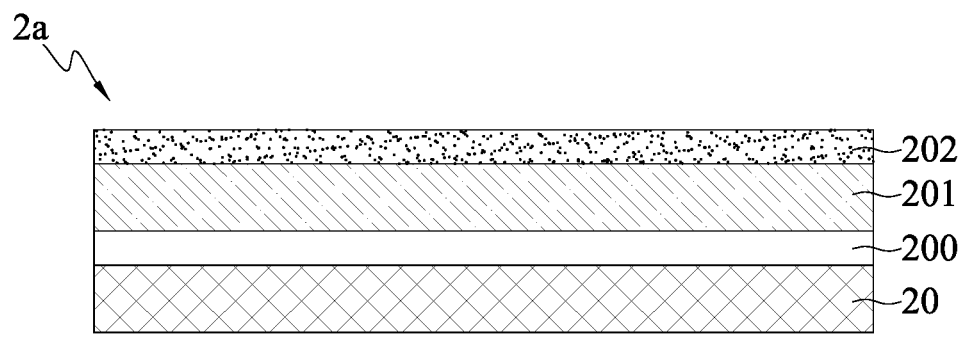
FIGS. 2A to 2F are schematic cross-sectional views showing a method for fabricating an electronic package according to a first embodiment of the present disclosure.

Referring to FIG. 2A, a carrier structure 2a is provided, which has a carrier 20, and a release layer 200, a strengthening layer 201 and a bonding layer 202 are sequentially formed on the carrier 20.

In an embodiment, the carrier 20 is made of a semiconductor material such as glass or other suitable materials, and the bonding layer 202 is an adhesive layer such as a tape.

Further, the strengthening layer 201 is made of a silicon-containing material such as polysiloxane, silicon dioxide or other suitable components. For example, the strengthening layer 201 comprises polysiloxane, silicon dioxide and polyethylene terephthalate (PET) film. Based on the total weight of the strengthening layer 201, the composition of the strengthening layer 201 is shown as follows.

| Component | % by weight |
|---|---|
| polysiloxane | 5-30 |
| silicon dioxide | 1-20 |
| PET film | 60-85 |

Furthermore, the release layer 200 can be made of various materials and there is no special limitation on it.

Figure 2B:
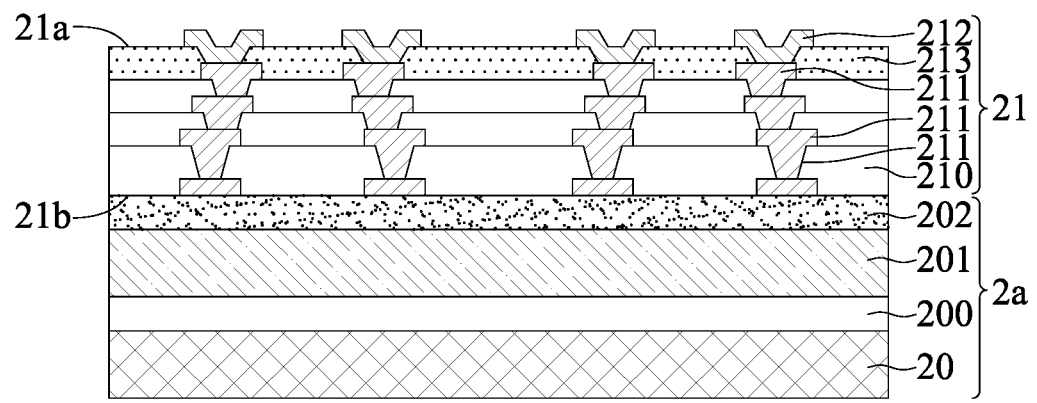

Referring to FIG. 2B, a circuit structure 21 is formed on the bonding layer 202 of the carrier structure 2a.

In an embodiment, the circuit structure 21 has a first side 21a and a second side 21b opposite to the first side 21a, and the circuit structure 21 is bonded to the bonding layer 202 via the second side 21b thereof.

Further, the circuit structure 21 has at least an insulating layer 210 and a circuit layer 211 formed on the insulating layer 210. For example, the circuit layer 211 is a fan-out type redistribution layer (RDL).

The circuit structure 21 can be fabricated in various processes. For example, a wafer process is employed to fabricate a copper circuit layer, and a chemical vapor deposition (CVD) process is performed to form silicon nitride or silicon oxide as an insulating layer 210. Alternatively, a general non-wafer process is employed to form a copper circuit layer 211 and a low-cost high polymer dielectric material such as polyimide (PI), polybenzoxazole (PBO), prepreg (PP), molding compound, a photosensitive dielectric layer or the like is formed by coating as an insulating layer 210.

Further, an insulating protection layer 213 made of such as a solder mask material can be formed on the first side 21a of the circuit structure 21, and portions of the circuit layer 211 are exposed from the insulating protection layer 213 so as to serve as conductive pads 212.

Figure 2C:
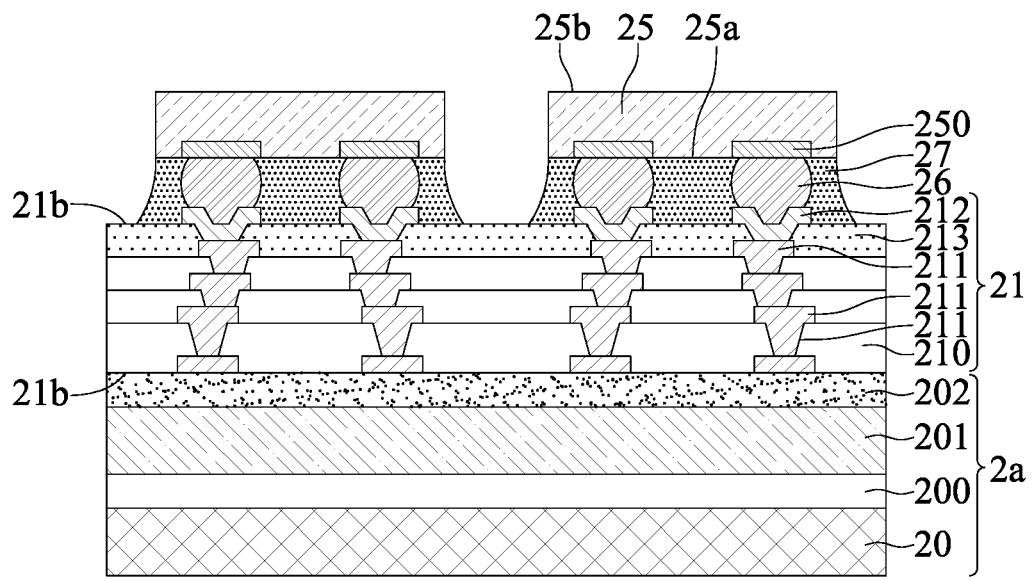

Referring to FIG. 2C, at least an electronic element 25 is disposed on the first side 21a of the circuit structure 21.

In an embodiment, the electronic element 25 is an active element such as a semiconductor chip, a passive element such as a resistor, a capacitor or an inductor, or a combination thereof. For example, the electronic element 25 is a semiconductor chip having an active surface 25a with a plurality of electrode pads 250 and an inactive surface 25b opposite to the active surface 25a. The electrode pads 250 of the electronic element 25 are flip-chip disposed on and electrically connected to the conductive pads 212 through a plurality of conductive bumps 26 made of such as copper or a solder material. Further, an underfill 27 can be formed between the active surface 25a of the electronic element 25 and the circuit structure 21 to encapsulate the conductive bumps 26.

Figure 2D:
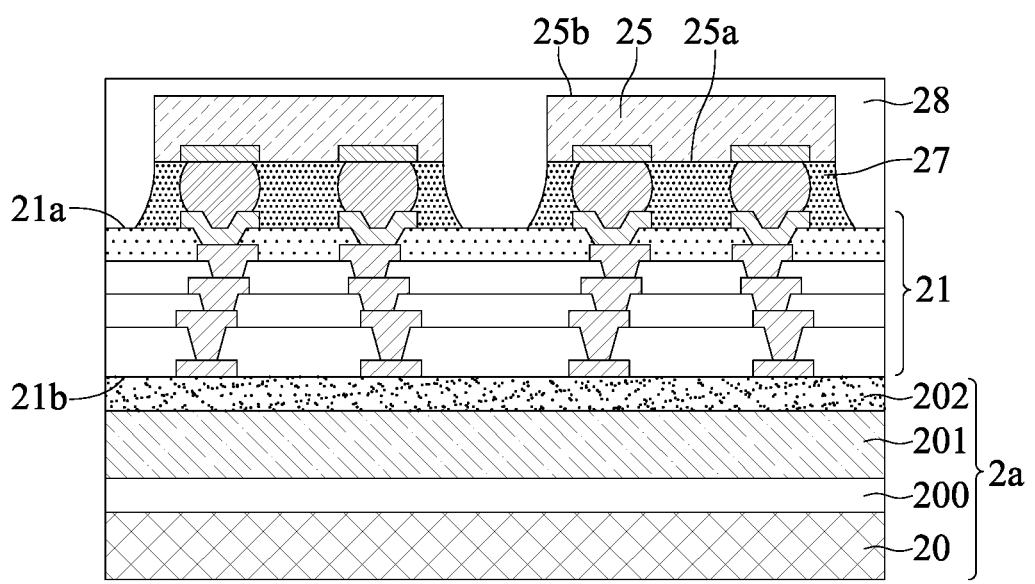
Figure 2D:
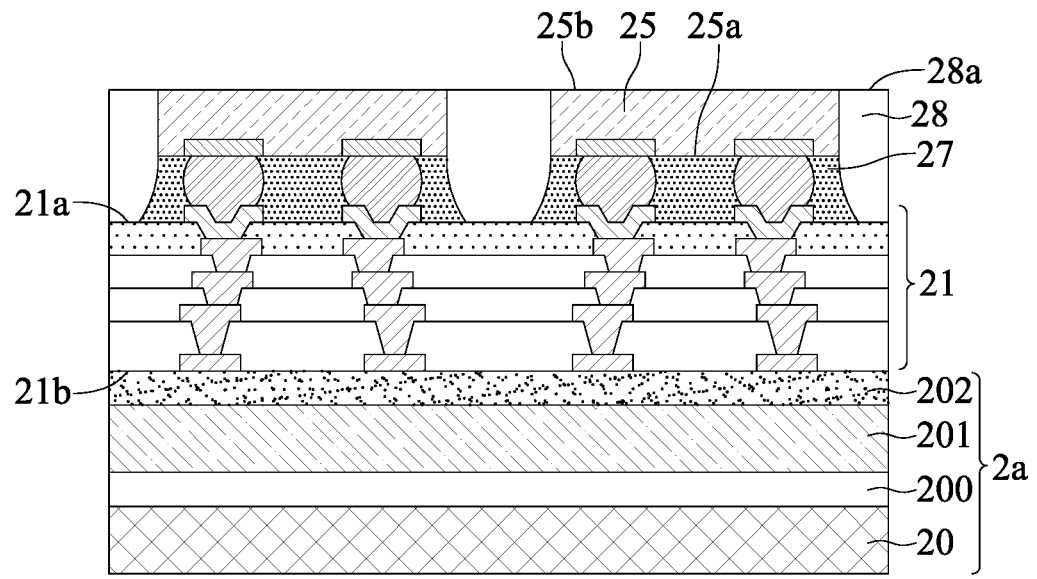

Referring to FIG. 2D, an encapsulant 28 is formed on the first side 21a of the circuit structure 21 (or the insulating protection layer 213) for encapsulating the electronic element 25.

In an embodiment, the encapsulant 28 is made of an insulating material such as polyimide, a dry film, an epoxy resin or a molding compound, and formed on the insulating protection layer 213 of the circuit structure 21 by lamination, coating or molding.

Further, referring to FIG. 2D', a thinning process can be performed by such as grinding so as to remove a portion of the encapsulant 28, thus exposing the inactive surface 25b of the electronic element 25 from the encapsulant 28. For example, the surface 28a of the encapsulant 28 is flush with the inactive surface 25b of the electronic element 25.

Figure 2E:
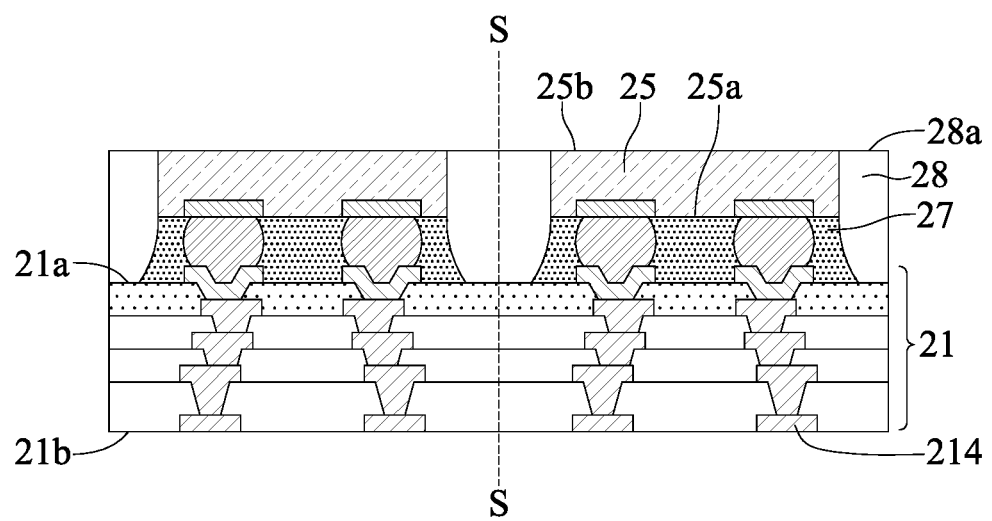

Referring to FIG. 2E, continued from FIG. 2D', after the encapsulant 28 is cured by baking, the carrier structure 2a is removed to expose the second side 21b of the circuit structure 21.

Figure 2F:
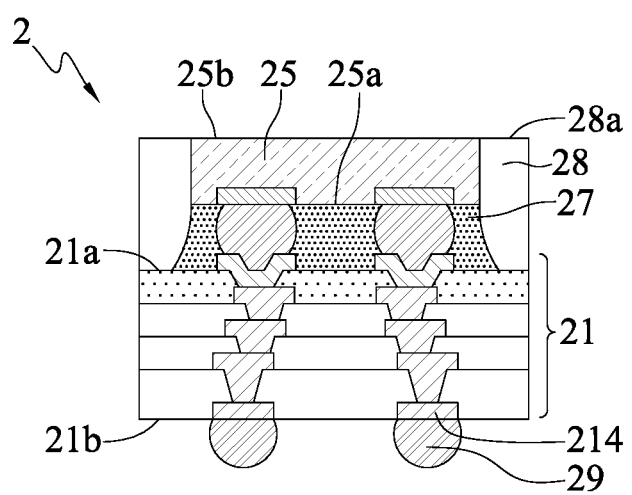

Referring to FIG. 2F, a plurality of conductive elements 29 such as solder balls are formed on ball-planting pads 214 of the second side 21b of the circuit structure 21 so as for a packaging structure or another package or an electronic device such as a semiconductor chip to be disposed thereon. Thereafter, a singulation process is performed along a cutting path S of FIG. 2E so as to obtain a plurality of electronic packages 2.

According to the present disclosure, the strengthening layer 201 is positioned between the carrier 20 and the bonding layer 202 so as to prevent delamination from occurring between the carrier 20 and the bonding layer 202 during a thermal processes such as the flip-chip process or the curing process (e.g., by baking) of the encapsulant 28. Compared with the prior art, the present disclosure prevents not only damage of the carrier structure 2a but also delamination of the insulating layer 210 along with the bonding layer 202.

FIGS. 3A to 3D are schematic cross-sectional views showing a method for fabricating an electronic package 3 according to a second embodiment of the present disclosure. The second embodiment differs from the first embodiment in the packaging process of the electronic element.

Figure 3A:
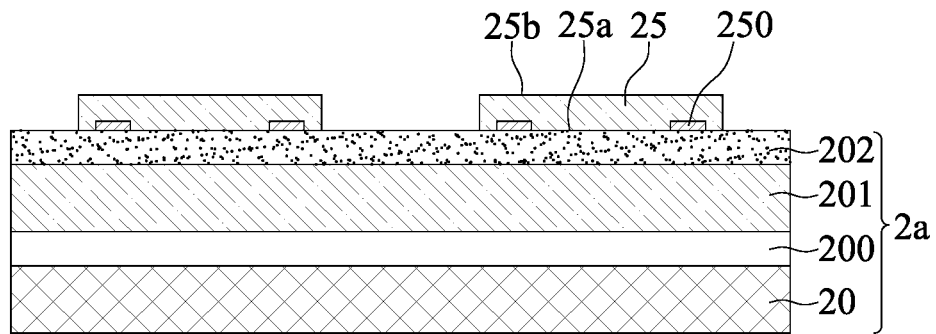
FIGS. 3A to 3D are schematic cross-sectional views showing a method for fabricating an electronic package according to a second embodiment of the present disclosure.

Referring to FIG. 3A, continued from the process of FIG. 2A, at least an electronic element 25 is disposed on the bonding layer 202 of the carrier structure 2a.

In an embodiment, the electronic element 25 is attached onto the bonding layer 202 via the active surface 25a thereof.

Figure 3B:
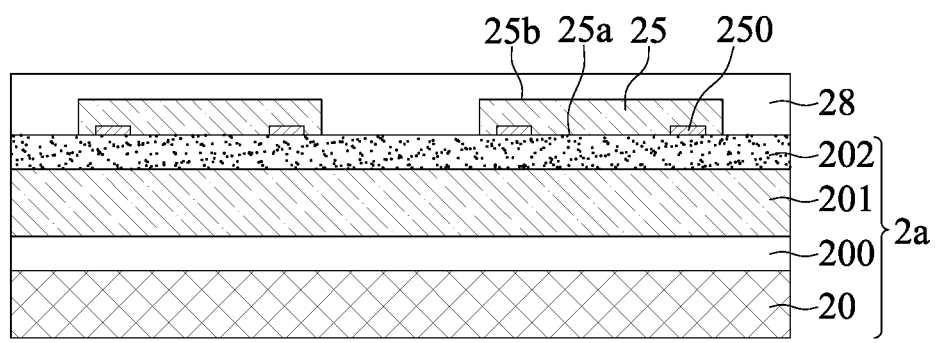
Figure 3B:
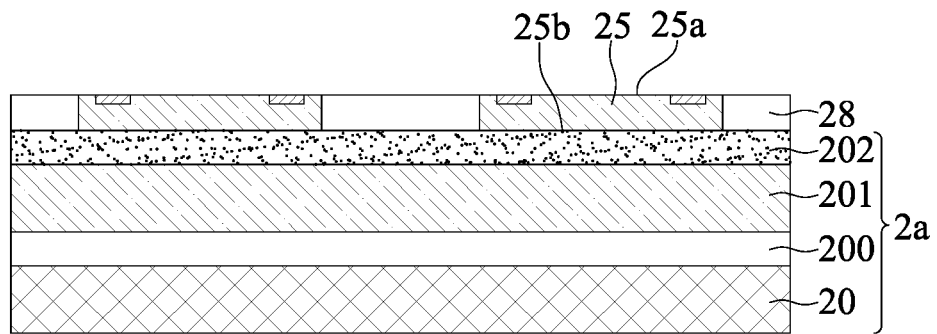

Referring to FIG. 3B, an encapsulant 28 is formed on the bonding layer 202 of the carrier structure 2a for encapsulating the electronic element 25. Thereafter, the encapsulant 28 is cured by baking.

In an embodiment, referring to FIG. 3B', the electronic element 25 can be attached onto the bonding layer 202 via the inactive surface 25b thereof.

Figure 3C:
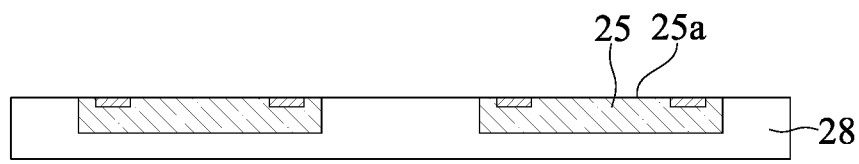
Figure 3C:
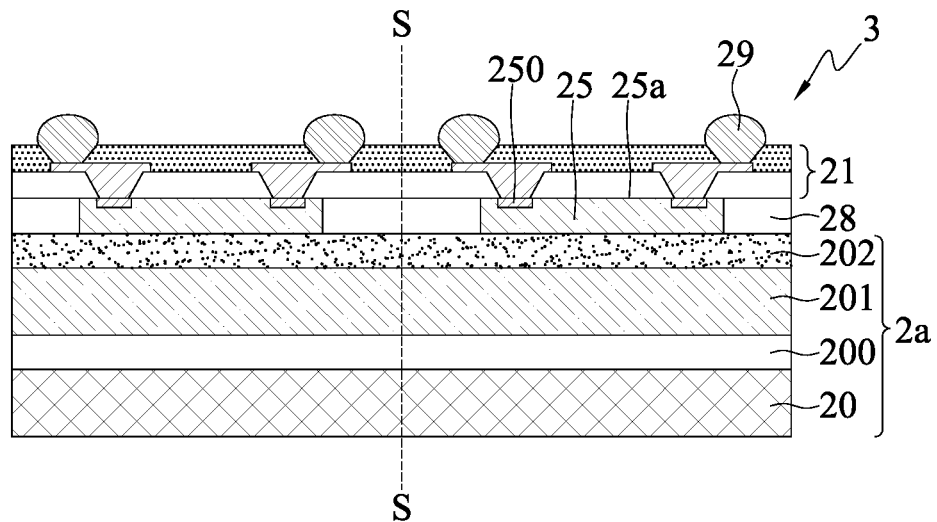
Figure 3D:
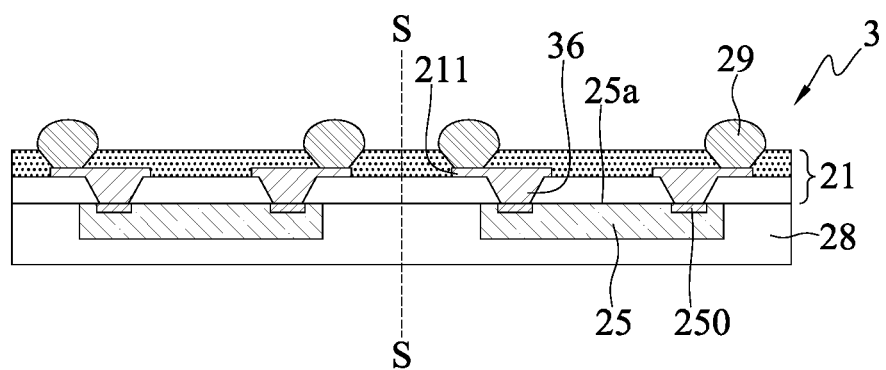
Figure 3D:
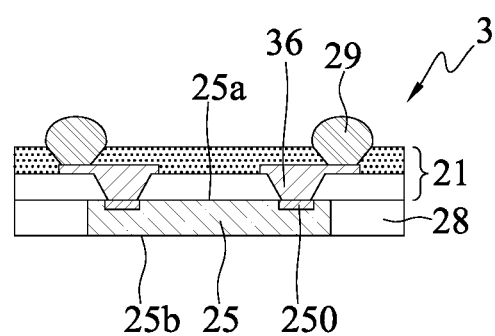

Referring to FIGS. 3C to 3D, continued from FIG. 3B, the carrier structure 2a is removed to expose the active surface 25a of the electronic element 25. Then, a circuit structure 21 is formed on the encapsulant 28 and the active surface 25a of the electronic element 25. Thereafter, a plurality of conductive elements 29 are formed on the circuit structure 21 and then a singulation process is performed along a cutting path S so as to obtain a plurality of electronic packages 3.

In an embodiment, the circuit layer 211 of the circuit structure 21 is electrically connected to the electrode pads 250 of the electronic element 25 through a plurality of conductive vias 36.

Further, referring to FIGS. 3C' to 3D', continued from the process of FIG. 3B', a circuit structure 21 is formed on the encapsulant 28 and the active surface 25a of the electronic element 25, and then the carrier structure 2a is removed to expose the inactive surface 25b of the electronic element 25. Furthermore, a plurality of conductive elements 29 are formed on the ball-planting pads 214 of the second side 21b of the circuit structure 21 and then a singulation process is performed along a cutting path S so as to obtain a plurality of electronic packages 3.

Therefore, the strengthening layer 201 is positioned between the carrier 20 and the bonding layer 202 so as to prevent delamination from occurring between the carrier 20 and the bonding layer 202 during a thermal process such as the curing process (e.g., by baking) of the encapsulant 28. Compared with the prior art, the present disclosure prevents damage of the carrier structure 2a and the electronic element 25 (e.g., oxidation or scratching).

It should be understood that the semiconductor packaging process can be varied and not limited to the first and second embodiments of the present disclosure.

Therefore, through the design of the strengthening layer, the present disclosure prevents delamination of the carrier structure under high temperature and hence allows the required process to be performed smoothly, thereby improving the reliability of the fabrication method.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims

What is claimed is:

1. A carrier structure, comprising:
    a carrier;
    a release layer formed on the carrier;
    a strengthening layer formed on the release layer and comprising 5 to 30 wt % of polysiloxane, 1 to 20 wt % of silicon dioxide, and 60 to 85 wt % of polyethylene terephthalate (PET) film, based on a total weight of the strengthening layer, and
    a bonding layer formed on the strengthening layer.

2. A method for fabricating an electronic package, comprising:
    providing the carrier structure of claim 1;
    performing a packaging process of an electronic element on the carrier structure; and
    removing the carrier structure.

3. The method of claim 2, wherein the packaging process of the electronic element comprises:
    forming a circuit structure on the carrier structure;
    disposing the electronic element on the circuit structure; and
    forming an encapsulant on the circuit structure for encapsulating the electronic element.

4. The method of claim 3, further comprising after removing the carrier structure, exposing the circuit structure to form conductive elements on the circuit structure.

5. The method of claim 2, wherein the packaging process of the electronic element comprises:
    disposing the electronic element on the carrier structure; and
    forming an encapsulant on the carrier structure for encapsulating the electronic element.

6. The method of claim 5, further comprising after removing the carrier structure, forming a circuit structure on the encapsulant and the electronic element, wherein the circuit structure is electrically connected to the electronic element.

7. The method of claim 5, further comprising before removing the carrier structure, forming a circuit structure on the encapsulant and the electronic element, wherein the circuit structure is electrically connected to the electronic element.

8. The method of claim 6, further comprising forming conductive elements on the circuit structure.

9. The method of claim 7, further comprising forming conductive elements on the circuit structure.

10. The method of claim 2, further comprising after removing the carrier structure, performing a singulation process.

* * * * *